United States Patent [19]
Woodward et al.

[11] Patent Number: 4,731,700
[45] Date of Patent: Mar. 15, 1988

[54] SEMICONDUCTOR CONNECTION AND CROSSOVER APPARATUS

[75] Inventors: Gary K. Woodward; Stephen R. Belcher, both of Kokomo, Ind.

[73] Assignee: Delco Electronics Corporation, Kokomo, Ind.

[21] Appl. No.: 13,959

[22] Filed: Feb. 12, 1987

[51] Int. Cl.$^4$ .............................................. H05K 7/20
[52] U.S. Cl. ..................................... 361/388; 357/80; 357/81; 361/401
[58] Field of Search ........................... 174/68.5, 52 FP; 357/68, 70, 80, 81; 361/386, 387, 388, 400, 401, 408, 410, 414

[56] References Cited

U.S. PATENT DOCUMENTS

| | | | |
|---|---|---|---|
| 3,374,537 | 3/1968 | Doelp, Jr. | 357/70 |
| 3,480,836 | 11/1969 | Aronstein | 357/80 |
| 3,646,246 | 2/1972 | Olney, Jr. | 361/400 |
| 3,833,838 | 9/1974 | Christiansen | 174/68.5 |
| 4,320,438 | 3/1982 | Ibrahim | 361/401 |
| 4,404,059 | 9/1983 | Livshits | 174/68.5 |
| 4,472,876 | 9/1984 | Nelson | 361/414 |
| 4,595,945 | 6/1986 | Graver | 357/70 |
| 4,654,694 | 3/1987 | Val | 361/401 |
| 4,663,649 | 5/1987 | Suzuki | 357/81 |

OTHER PUBLICATIONS

An unidentified photo showing views of Wire Bonding, Direct Mount TAB, and Double Density TAB.

Primary Examiner—G. P. Tolin
Attorney, Agent, or Firm—Robert J. Wallace

[57] ABSTRACT

A ceramic member with thick film conductors is mounted on a heat sink and a silicon integrated circuit (chip) is placed through a hole in the ceramic member and is soldered by a back surface (the substrate) to the heat sink. A tape automated bonding lead frame is used to provide conductors that are soldered to bonding pads on the ceramic member and are compression bonded to conductive bumps on the chip and to provide other conductors that are soldered to pads on the ceramic member and crossover a front active surface of the chip. These crossover conductors are air isolated from the chip and allow an increase in interconnect density. The attachment of the semiconductor substrate to the heat sink provides good heat dissipation.

9 Claims, 6 Drawing Figures

SEMICONDUCTOR CONNECTION AND CROSSOVER APPARATUS

FIELD OF INVENTION

This invention relates to apparatus which facilitates the electrical connection of an integrated circuit to other integrated circuits and/or components and, in particular, facilitates the electrical connection of a semiconductor integrated circuit (a "chip") to other chips and/or components.

BACKGROUND OF THE INVENTION

Advances in semiconductor design and processing have provided very complex semiconductor chips which are now several hundred mils on a side and dissipate watts of power. The aforesaid size and power requirements have also increased the complexity and cost of providing interconnections and packaging for semiconductor chips. As chip yields improve and the cost per chip declines, the cost of interconnecting and packaging the chip becomes a significant part of the total cost of providing circuits such as memories, central processors, amplifiers, or custom integrated circuits.

To reduce cost and increase reliability, some interconnection designs mount one or more semiconductor chips on insulator substrates such as a ceramic or a printed wiring board. Printed wiring boards may be either flexible or rigid. Many of these substrate designs require multilayer conductor planes due to the size and complexity of the newer semiconductor chips. Multilayer printed wiring boards are more expensive than just top and/or lower printed wiring boards and therefore add to the overall cost of each system they are a part of.

Attempts have been made to use the area under a chip to route conductors. U. S. Pat. No. 4,595,945 (R. N. Grover) employs a structure which has a support paddle of a lead frame which is split electrically to provide conductor members that cross under the chip after the chip is bonded to the paddle. The chip is electrically isolated from the crossunder members by a separate Kapton film which is inserted between the lead frame and the chip. Wire bonds are made from the upper surface of the chip down to the lead frame to make the connections which are prevented by the Kapton film. This not only increases the number of wire bonds but the Kapton film also acts as a thermal barrier in the removal of heat from the chip. Assembly of the Grover structure is also complicated by the need to insert, accurately locate, and bond a Kapton film between the chip and split paddle lead frame. Another complication is in the wire bonding operation because the upper plane of the chip bonding sites is above the plane of the lead frame by the thickness of the Kapton film, the adhesive, and the chip. This requires longer loops on the wire bonds which increases the space needed between wire bond sites to prevent short circuits during vibration.

U. S. Pat. No. 3,374,537 (W. L. Doelp, Jr.) employs a transparent glass substrate having an upper surface on which is defined a conductor pattern to interconnect the contact area and interconnection film of one monolithic flip chip to the contact area and interconnection film of another. The transparent substrate is preferred for face down chip bonding, but this limits the heat dissipation capability due to the lower thermal conductivity of glass as compared to ceramic substrates. In addition, with face-down chip attachment, the back surface of the chip is not attached to a heat sink. Thus, all the heat generated by the chip must be transferred to the substrate by conduction through the small areas of the solder bumps between the chip and substrate.

It is desirable to provide an interconnect apparatus which can be used to interconnect a semiconductor chip to other chips and/or components and can provide an electrical crossover in the area above a semiconductor chip while having the substrate of the chip bonded to a heat sink.

SUMMARY OF THE INVENTION

The present invention is directed to interconnection apparatus which facilitates electrical connections to an upper active surface of an integrated circuit (IC) and allows electrical conductors to cross over above the upper surface of the IC. The crossover feature of the apparatus allows for a density of interconnection which might not be otherwise possible without using another level of interconnect on the apparatus.

The apparatus comprises an insulator member having an upper surface and portions thereof which define a recessed region which has an upper perimeter which intersects the upper surface and has dimensions which facilitate the acceptance of an IC therein. A plurality of separated conductors have portions which are on the upper surface of the insulator member. A first of these conductors also has a portion which extends into the recessed region and is adapted to be electrically coupled to an IC placed in the recessed region. A second of these conductors has a portion which extends completely across a portion of the recessed region and is electrically isolated from an IC placed in the recessed region.

A preferred embodiment of the present invention further comprises a heat sink. The recessed region of the insulator member, which is typically a ceramic member, extends completely through the insulator member so as to be a hole there through. The ceramic member is placed on top of the heat sink such that an open container is formed whose bottom is the heat sink and whose sidewalls are portions of the ceramic member. An IC is placed in the container with a bottom surface (typically the substrate of a silicon IC) thereof in contact with the heat sink and a top active surface thereof containing conductive bumps facing the upper surface of the insulator member. The substrate of the IC is typically soldered to the heat sink. Conductors are formed on the upper surface of the ceramic member. These conductors, which are typically formed using thick film techniques, are denoted as outer conductors. Some of these outer conductors terminate at conductive bonding pad areas which are on the upper surface of the ceramic member and are located at or near the perimeter of the hole.

Conductors which are to contact the bumps of the IC or are to cross over the IC are denoted as inner conductors and are typically part of a tape automated bonding lead frame. Outer ends of the conductors of the lead frame are typically soldered to the bonding pads, and inner ends of these conductors are compression bonded to the IC by applying sufficient pressure and temperature to the inner ends to cause the bumps they are intended to contact to be compressed and to form a relatively low resistance electrical connection to these inner conductors. The inner conductors that cross over the IC are typically air isolated from the IC and are trestle-like structures. The low mass of the crossover inner leads, the air isolation, and an insulator layer typically formed on the surface of the IC are typically sufficient to prevent electrical shorting even under conditions of vibration.

The inclusion of a crossover conductor in the conductor array which is ordinarily used in tape automated bonding allows the use of the area over a semiconductor chip to connect components on the ceramic member. This might otherwise require an additional layer of circuitry on the ceramic member and the interconnection of the conductive layers. Additional wiring layers add to the complexity, and, hence, the cost of the ceramic member which is a significant part of the overall cost of a packaged semiconductor. The crossover is attached in the same bonding operation which is used to interconnect the chip to the bonding pads of the ceramic member. Because there is bonding to the active upper surface of the chip, the back of the chip is available for bonding to a heat sink. This allows for good power dissipation from the chip which is a critical design factor.

In another embodiment the ceramic member is replaced by a Mylar member which has a foil conductor layer that is patterned so as to form all the conductors. The conductors which are to electrically contact the IC are compression bonded to the bumps on the IC.

These and other features and advantages of the invention will be apparent from the following detailed description and drawings.

DETAILED DESCRIPTION

Figure 1:
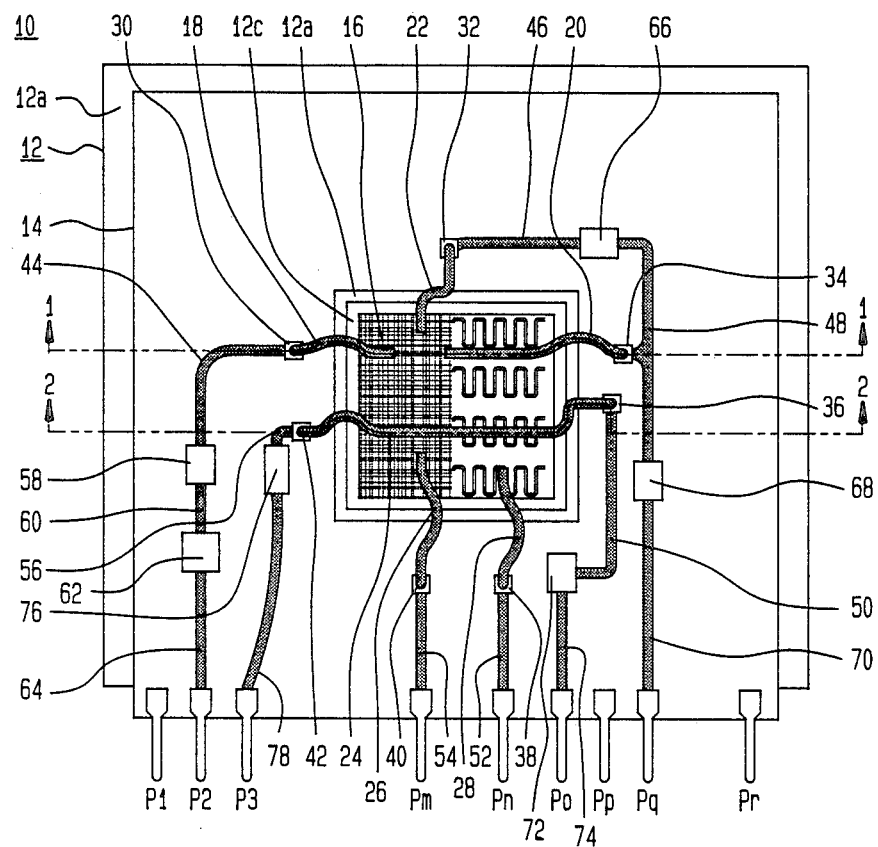
FIG. 1 shows a top view of one embodiment of the present invention.
Figure 2:
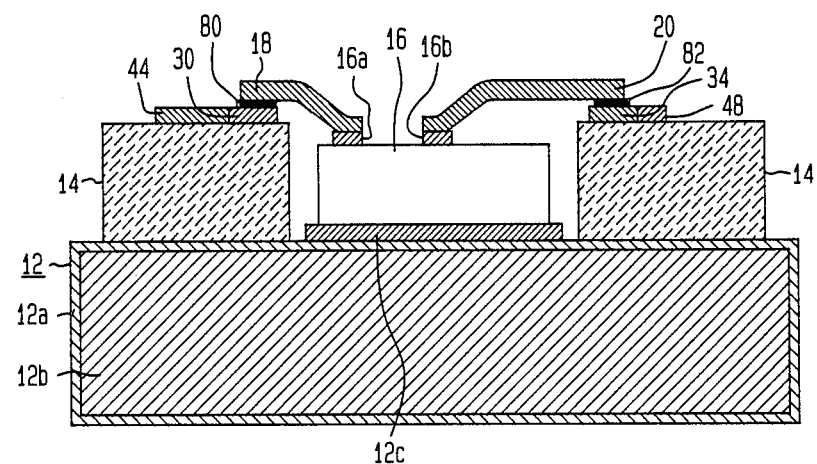
FIGS. 2 and 3 show cross-sectional views taken along dashed line 1—1 and 2—2, respectively, of FIG. 1.
Figure 3:
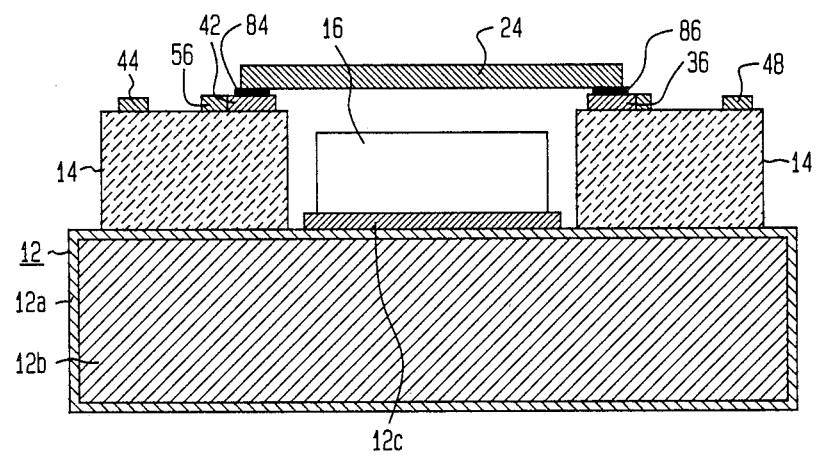

Referring now to FIGS. 1, 2 and 3 there is shown a top view and a first and second cross-sectional views of a preferred embodiment of the present invention which comprises apparatus 10 which is useful to interconnect an integrated circuit (typically a semiconductor chip) 16, to other components and to pins of apparatus 10. Apparatus 10 comprises a heat sink 12, an insulator member 14, a plurality of bonding pads 30, 32, 34, 36, 38, 40 and 42, inner conductors 18, 20, 22, 24, 26 and 28, outer conductors 44, 46, 48, 50, 52, 54 and 56, connecting conductors 60, 64, 70, 74 and 78, electrical components 58, 62, 66, 68, 72 and 76, and pins P1, P2, P3, Pm, Pn, Po, Pp, Pg and Pr. Heat sink 12 has a central core portion 12b which is covered by a layer 12a. A portion of 12a is covered by layer 12c. Chip 16 has a top active surface having a plurality of conductive bumps, two of which, 16a and 16b, are shown in FIG. 2. All of the inner conductors, except for conductor 24, are compression bonded by first ends to a bump on chip 16 and are soldered by second ends to one of bonding pads 32, 36, 38, 40 or 42. FIG. 2 shows inner conductors 18 and 20 compression bonded by first ends to bumps 16a and 16b, respectively, and soldered through solder layers 80 and 82, respectively, to bonding pads 30 and 34, respectively. A bottom surface of chip 16 is soldered to portion 12c of heat sink 12. This facilitates heat removal from chip 16. As is shown in FIG. 3, inner conductor 24 crosses over a major active surface of chip 16. This allows for an increase in the density of components mounted on the insulator member 14 and/or for an increase in the density of the conductors on insulator member 14 while still maintaining good heat transfer between chip 16 and heat sink 12.

Insulator member 14 is typically a ceramic member; chip 16 is typically a silicon integrated circuit; the conductive bumps and conductors are typically copper; and portions 12a, 12b and 12c of heat sink 12 are typically a tin/nickel alloy, copper and molybdenum, respectively. The conductive bumps are typically one mil high before bonding and are 0.8 mils high after the bonding of a conductor thereto. The upper active surface of the chip is typically 2 to 5 mils below the surface of the ceramic member 14 on which the bonding pads exist. The components can be resistors, capacitors, inductors, transformers or a wide variety of other components.

Conductor 44 couples pad 30 to component 58; conductor 60 couples component 58 to component 62; and conductor 64 couples component 62 to pin P2. Conductor 46 couples pad 32 to component 66; conductor 48 couples component 66 to pad 34 and to component 68; and conductor 70 couples component 68 to pin Pq. Conductor 50 couples pad 36 to component 72, and conductor 74 couples component 72 to pin Po. Conductor 52 couples pad 38 to pin Pm. Conductor 54 couples pad 40 to pin Pm. Conductor 56 couples pad 42 to component 64, and conductor 78 couples component 76 to pin P3. Pins P1 and Pr are not shown coupled to any components or the chip. They are spare pins which can be used if needed.

The pins of apparatus 10 are designed to fit into a female connector (not shown).

For the sake of simplicity there are shown only five electrical connections to the upper surface of chip 16, one crossover (conductor 24) over chip 16 and six components mounted on insulator member 14. Many other connections to chip 16 and other crossovers over chip 16, as well as additional components and pins, are possible.

The inner conductors are typically part of a tape automated bonding lead frame. Outer ends of the conductors of the lead frame are typically soldered to the bonding pads, and inner ends of these conductors are compression bonded to the chip by applying sufficient pressure and temperature to inner ends thereof to cause the bumps they are intended to contact to be compressed and to form a relatively low resistance electrical connection to these inner conductors. The inner conductors that crossover the chip are typically air isolated from the chip and are trestle-like structures. The low mass of the crossover inner leads, the air isolation, and an insulator layer typically formed on a major surface of the chip are typically sufficient to prevent electrical shorting even under conditions of vibration.

The inclusion of a crossover conductor in the conductor array which is ordinarily used in tape automated bonding allows the use of the area over chip 16 to connect components on the ceramic member 14. This might otherwise require an additional layer of conductors on the ceramic member and the interconnection of those layers. Additional wiring layers add to the complexity, and, hence, the cost of the ceramic member 14 which is a significant part of the overall cost of a packaged semiconductor. The crossover is attached in the same bonding operation which is used to interconnect the chip to the bonding pads on the ceramic member. Because there is bonding to the active upper surface of the chip, the back of the chip is available for bonding to a heat sink. This allows for good power dissipation from the chip which is a critical design factor. Typically a bias potential is applied through the heat sink 12 to the substrate of the chip 16.

The conductors which crossover all or part of ceramic member 14 are shown having loop like portions which are designed to protect against shock and vibrations.

Figure 4:
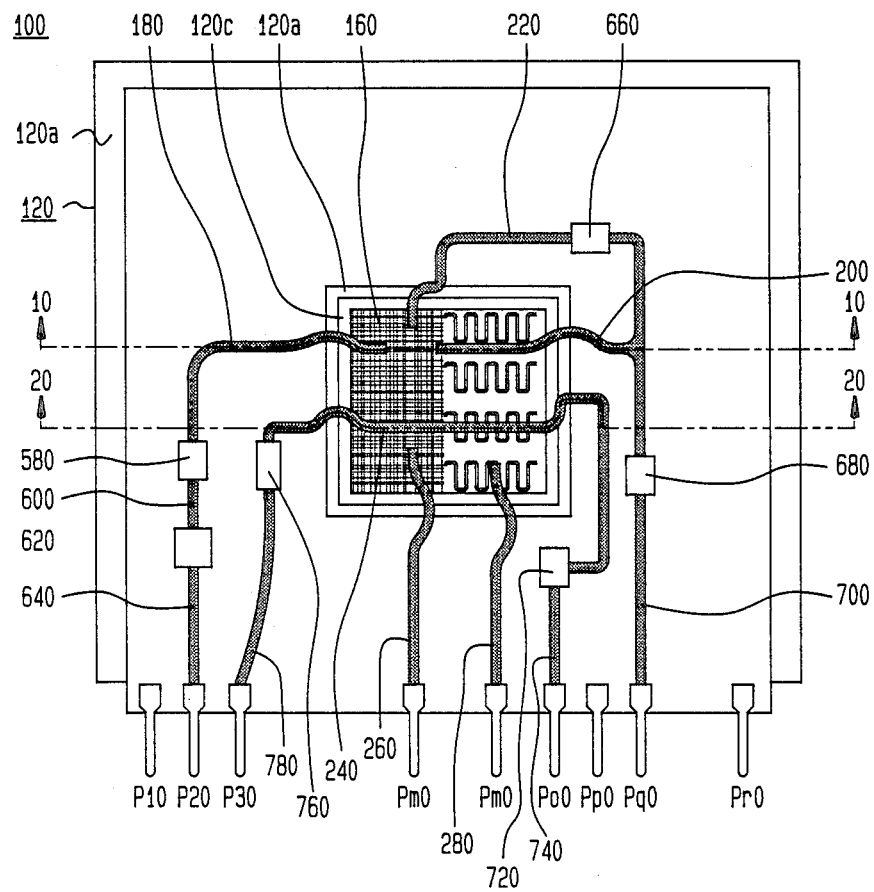
FIG. 4 shows a top view of another embodiment of the present invention.
Figure 5:
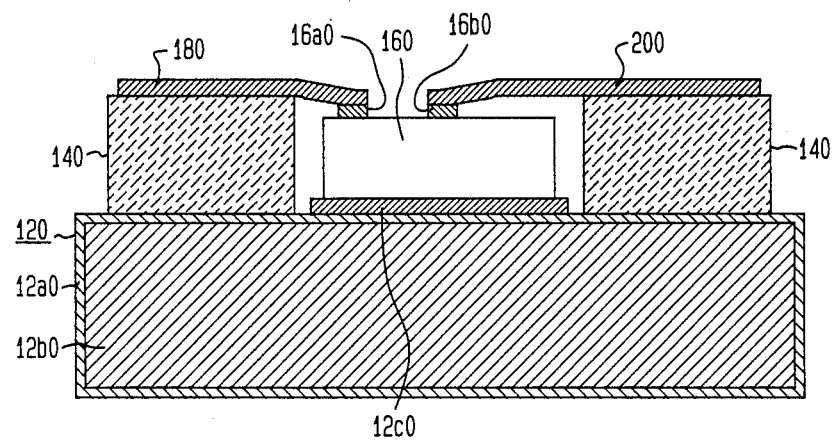
FIGS. 5 and 6 show cross-sectional views taken along dashed lines 10—10 and 20—20, respectively, of FIG. 4. It is to be noted that the drawings are not to scale so as to better highlight the important features of the invention. To avoid confusion, no background lines are shown in the cross sectional views of the drawings.
Figure 6:
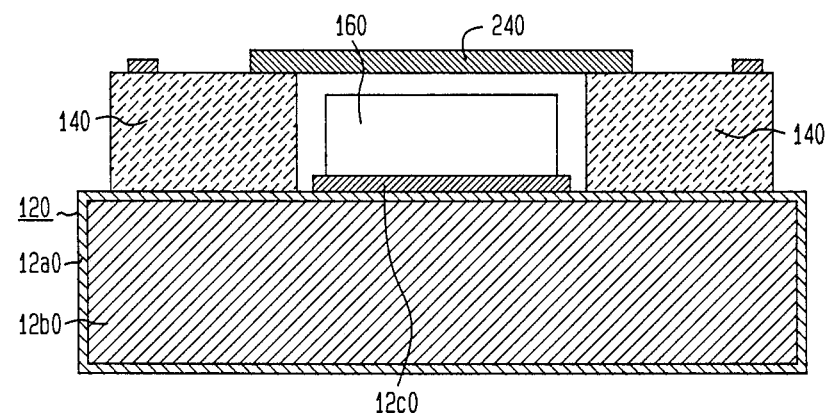

Referring now to FIGS. 4, 5 and 6, there is shown a top view and a first and second cross-sectional views of another embodiment of the present invention which comprises apparatus 100 which is useful to connect an integrated circuit (typically a semiconductor chip) 160 to components and pins of apparatus 100. Apparatus 100 comprises a heat sink 120, an insulator member 140, a plurality of conductors 180, 200, 220, 240, 260, 280, 600, 640, 700, 740 and 780, electrical components 580, 620, 660, 680, 720 and 760, and pins P10, P20, P30, PnO, PmO, PoO, PpO, PgO and PrO. Heat sink 120 has a central core portion 12b0 which is covered by a layer 12a0. A portion of layer 12a0 is covered by layer 12c0. Chip 160 has a top active surface having a plurality of conductive bumps, two of which, 16a0 and 16b0, are shown in FIG. 5. Conductors 180, 200, 220, 260 and 280 are compression bonded by first ends to bumps of chip 160. FIG. 5 shows conductors 180 and 200 connected to bumps 16a0 and 16b0, respectively. A bottom surface of chip 160 is soldered to 12c0. This facilitates heat removal from chip 160. As is shown in FIG. 6, inner conductor 240 crosses over chip 120. This allows for increased density of components mounted on insulator member 140 and/or an increase in the density of conductors on insulator member 140 while still maintaining good heat transfer between chip 160 and heat sink 120.

Insulator member 140 is typically made of mylar; chip 160 is typically a silicon integrated circuit; the conductive bumps and conductors are typically copper; and portions 12a0, 12b0 and 12c0 of heat sink 120 are typically a tin/nickel alloy, copper and molybdenum, respectively. The components can be resistors, capacitors, inductors, transformers or a wide variety of other components.

Apparatus 100 is very similar to apparatus 10 of FIG. 1 except a mylar member is substituted for the ceramic member and all conductors are formed out of a metallic layer formed on the upper surface of mylar member 140. Thus, there is no need for the bonding pads of FIG. 1 and for separate inner and outer conductors. All components, conductors and the chip of FIGS. 4, 5 and 6 that are identical or similar to those of FIGS. 1, 2 and 3 have the same reference number or letter with a "0" added thereafter.

Conductor 180 is coupled at one end to bump 16a0 of chip 160 and is coupled at an opposite end to component 580; conductor 600 couples component 580 to component 620; and conductor 640 couples component 620 to pin P20. Conductor 220 is coupled at one end to a bump of chip 160 and is coupled by an opposite end to component 660; conductor 200 is coupled by a first end to bump 16b0 of chip 160 and is coupled by second and third ends to components 660 and 680, respectively; and conductor 700 couples component 680 to pin Pq0. Conductor 240, which crosses over chip 160, couples components 740 and 760; conductor 740 couples component 720 to pin Po0; and conductor 780 couples components 760 to P30. Conductor 280 is coupled by one end to a bump of chip 160 and is coupled by another end to pin PnO. Conductor 260 is coupled by one end to a bump of chip 160 and is coupled by another end to pin PmO.

All of the pins of apparatus 100 are adapted to fit into a female connector (not shown).

For the sake of simplicity only five connections to chip 160, one crossover over chip 160 and six components mounted on insulator member 140 are shown. Many other connections to chip 160 and other crossovers over chip 160, as well as additional components and pins, are possible.

It is understood that the embodiments described herein are merely illustrative of the general principles of the invention. Various modifications are possible consistent with the spirit of the invention. For example, insulator members 14 and 140 can have multiple layers of interconnections. Further, a wide variety of different insulator materials can be used. Still further, the bumps of chips 16 and 160 can be replaced by bonding pads. Furthermore, the bonding pads of insulator members 14 and 140 could each have a conductive bump placed thereon. Still further, the conductors and bumps could be a wide variety of different conductors such as gold or silver. Furthermore, a variety of different heat sinks could be substituted for heat sinks 12 and 120. Still further, each of the conductors which contact chips 16 and 160 are in many cases not run in straight lines and can make more than one contact per chip. Furthermore, the conductors which crossover chips 16 and 160 are in many cases not run in straight lines. Still further, a crossover of a semiconductor chip can be effectively achieved by bonding first ends of two conductors to the same portion of the chip and bonding second ends of the conductors to different bonding pads on a ceramic member. The portion of the chip which is contacted can be in electrical contact with other portions of the chip but need not be. Futhermore, a crossover of a semiconductor chip can be effectively made by bonding a first end of each of two conductors to separate portions of a chip which are connected together on the chip surface.

The embodiments of the invention in which an exclusive property or privilege is claimed are defined as follows:

1. Interconnection apparatus comprising: an insulator member having an upper surface and portions thereof which define a recessed region which has an upper perimeter which intersects the upper surface and receives an integrated circuit therein; and a plurality of conductors;

a first of the conductors on the upper surface of the insulator member extends completely over the recessed region and passes over an integrated circuit placed in the recessed region without making electrical contact to the integrated circuit; and a second of the conductors has a portion thereof on the upper surface of the insulator member and has another portion thereof which extends into a portion of the recessed region and is electrically coupled to the integrated circuit placed in the recessed region with an upper major surface of the integrated circuit facing the perimeter of the recessed region.

2. The apparatus of claim 1 wherein: the first conductor comprises first, second, and third portions;
the first portion of first conductor is on the upper surface of the insulator member and has a first end at or near a first portion of the upper perimeter of the recessed region;
the second portion of the first conductor is on the upper surface and has a first end at or near a second portion of the perimeter of the recessed region; the third portion of the first conductor extends across the recessed region, is separated from the upper major surface of an integrated circuit placed in the recessed region, and has first and second ends which are electrically coupled to the first ends of the first and second portions of the first conductor, respectively; and
the third portion of the first conductor is electrically isolated from an integrated circuit placed in the recessed region.

3. The apparatus of claim 2 wherein:
the second conductor comprises first and second portions;
the first portion of the second conductor is on the upper surface of the insulator member and has a first end at or near a third portion of the upper perimeter of the recessed region; and
the second portion of the second conductor extends partly across the recessed region and has a first end which is electrically coupled to the first end of the first portion of the second conductor and has a second end which is adapted to be electrically coupled to a first portion of the upper surface of an integrated circuit placed in the recessed region.

4. The apparatus of claim 1 further comprising:
a relatively high thermal conductivity member having an upper surface coupled to a lower surface of an integrated circuit;
the recessed region in the insulator member extending completely through the insulator member such that the insulator member defines a hole there through; the insulator member having a lower surface which is in contact with the upper surface of the thermal conductivity member such that a lower open portion of the hole in the insulator member is covered by a portion of the upper surface of the thermal conductivity member; and
portions of the upper surface of the thermal conductivity member and the insulator member forming an open container within which the integrated circuit is placed with a lower surface thereof attached to portions of the upper surface of the thermal conductivity layer and an upper surface thereof to which electrical connections are to be made.

5. Interconnection apparatus comprising: an insulator member having upper and lower surfaces and defining a hole which extends through the insulator member and intersects the upper and lower surfaces;
a heat sink member which has an upper surface which is in contact with the lower surface of the insulator member such that a topless container-like structure is formed with portions of the upper surface of the heat sink forming the bottom of the container and the body of the insulator on the inside of the hole forming the side walls of the container;
a plurality of electrical outer conductors on the upper surface of the insulator member which have first ends located at or near portions of the upper surface which define an upper portion of the hole; a plurality of electrical inner conductors with at least one of the inner conductors spanning across the hole in the upper surface of the insulator and being electrically coupled to the first ends of two of the outer conductors and at least one of the inner conductors being electrically coupled to a first end of the outer conductors and spanning partly across the hole in the upper surface and being coupled by a second end thereof to an upper surface portion of an integrated circuit placed in the hole with a lower surface portion of the integrated circuit being coupled to the bottom of the container.

6. Connection and crossover apparatus coupling an integrated circuit having conductive bumps on a major active surface to components and/or other integrated circuits, and facilitating electrical crossovers over the major active surface of the integrated circuit comprising:
a ceramic member having upper and lower surfaces and defining a hole which extends through the ceramic member and intersects the upper and lower surfaces;
a heat sink having an upper surface which is in contact with the lower surface of the ceramic member such that a topless container-like structure having a bottom which is a portion of the upper surface of the heat sink and having side walls which are formed by the hole in the ceramic member is formed;
a plurality of outer conductors on the upper surface of the ceramic member which have first ends located at or near portions of the upper surface of the ceramic member which define the hole in the upper surface of the ceramic member, each of the first ends having a separate conductive bump attached thereto; a plurality of inner conductors;
at least one of the inner conductors spanning across the hole in the upper surface of the ceramic member and being electrically coupled by first and second ends thereof to the first end of each of two of the outer conductors; and
at least one of the inner conductors spanning partly across the hole in the upper surface of the ceramic member and being electrically coupled to a conductive bump on the major active surface of an integrated circuit which is in the hole and bonded by a second major surface to the bottom of the container.

7. Connection and crossover apparatus coupling an integrated circuit having conductive bumps on a major active surface to components and/or other integrated circuits and facilitating electrical crossovers over the major active surface of the integrated circuit comprising:
a ceramic member having upper and lower surfaces and defining a hole which extends through the ceramic member and intersects the upper and lower surfaces;
a heat sink having an upper surface which is in contact with the lower surface of the ceramic member such that a topless container-like structure having a bottom which is a portion of upper surface of the heat sink and having side walls which are formed by the hole in the ceramic member;
a plurality of separate outer conductors on the upper surface of the ceramic member which each have an end located near the hole;

the integrated circuit being in the hole and bonded by a second major surface thereof to the bottom of the container;

a tape automated bonding conductor lead frame assembly comprising a plurality of inner conductors with at least one of said inner conductors spanning across the hole and being bonded to at least two of the outer conductors and at least one other of said inner conductors spanning partly across the open portion of the container and being bonded to a conductive bump of the integrated circuit and to an end of an outer conductor.

8. The apparatus of claim 7 wherein the outer conductors are metal films.

9. The apparatus of claim 7 wherein the inner and outer conductors are copper.

* * * * *